United States Patent [19]

Ruesseler et al.

[11] Patent Number: 5,274,022
[45] Date of Patent: Dec. 28, 1993

[54] PAS, MELAMINE RESINS AND RUBBERS

[75] Inventors: Wolfgang Ruesseler; Burkhard Koehler, both of Krefeld, Fed. Rep. of Germany

[73] Assignee: Bayer Aktiengesellschaft, Leverkusen, Fed. Rep. of Germany

[21] Appl. No.: 838,033

[22] Filed: Feb. 20, 1992

[30] Foreign Application Priority Data

Mar. 2, 1991 [DE] Fed. Rep. of Germany ....... 4106694

[51] Int. Cl.$^5$ ................................................ C08K 3/30
[52] U.S. Cl. ...................................... 524/423; 524/424; 524/430; 524/447; 524/449; 524/451; 525/66; 525/92; 525/159; 525/163; 525/164; 525/189; 525/537
[58] Field of Search ............... 524/100, 423, 424, 430, 524/447, 449, 451; 525/66, 92, 159, 163, 164, 189

[56] References Cited

U.S. PATENT DOCUMENTS 3,998,767 12/1976 Walton .......................... 260/2.5 D
5,116,906 5/1992 Mizuno et al. .................. 525/146

FOREIGN PATENT DOCUMENTS 0345094 12/1989 European Pat. Off. .
0380108  8/1990 European Pat. Off. .
0406553  1/1991 European Pat. Off. .

Primary Examiner—Melvin I. Marquis
Assistant Examiner—Mark Sweet
Attorney, Agent, or Firm—Connolly and Hutz

[57] ABSTRACT

This invention relates to compositions of polyarylene sulphides (PAS), melamine resins and rubbers. The compositions are distinguished by very great toughness.

15 Claims, No Drawings

PAS, MELAMINE RESINS AND RUBBERS

This invention relates to compositions of polyarylene sulphides (PAS), melamine resins and rubbers. The compositions are distinguished by excellent toughness.

Polyarylene sulphides are known (e.g. US-A 3 354 129, EP-A 171 021). They are inert, high temperature resistant thermoplasts. These polymers, in particular polyphenylene sulphide (PPS), are increasingly used in fields which were hitherto the preserve of duroplasts.

PAS has unsatisfactory mechanical properties for certain applications in the field of injection moulding. The impact strength in particular is insufficient for practical purposes. It has therefore been found advantageous to improve PAS in these properties, for example by mixing it with other thermoplasts.

The improvement in the mechanical properties of PAS can also be achieved with mixtures of epoxides and hydrogenated diene rubbers grafted with maleic acid anhydride (e.g. JP-A 63 118369).

The mechanical properties of PAS may also be improved with polyisocyanates (e.g. JP-A01118-571) but the use of isocyanates is problematic for reasons of safety at work.

It is known (JP-A 061155, 83 0330) that when melamine resins and PPS are subjected to stoving temperatures below the melting temperature of PPS, they form coatings which are insoluble and infusible, in other words duroplastic. Such mixtures should therefore not be processible in the melt.

The toughness of thermoplasts is normally reduced by cross-linking.

It has now been found that mixtures of polyarylene sulphides (PAS) with melamine resins and rubbers are distinguished by good mechanical properties, in particular great toughness.

This invention therefore relates to mixtures of
A) from 94.9 to 40% by weight of polyarylene sulphides, preferably polyphenylene sulphide,
B) from 0.1 to 5% by weight of melamine resins corresponding to Formula (I) or (II), preferably Formula (I)

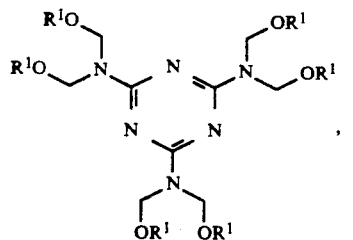

(I)

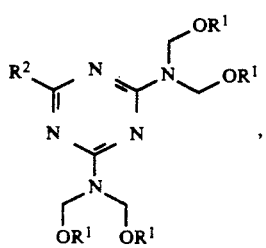

(II)

wherein
$R^1$ stands for hydrogen or an aliphatic $C_{1-22}$ group, preferably a methyl, ethyl or butyl group, and
$R^2$ stands for an aliphatic $C_{1-22}$ group or an aromatic $C_{6-14}$ group, preferably phenyl, and up to two alkoxymethyl groups of the substances I or II according to the invention may be replaced by hydrogen,
C) from 5 to 59.9% by weight, preferably from 10 to 25% by weight of rubbers, and
D) from 0 to 300 parts of inorganic fillers or reinforcing materials, based on 100 parts of the mixture (A+B+C).

The components are mixed in the molten state in kneaders or extruders at temperatures from 280° C. to 350° C.

The following are examples of melamine resins corresponding to Formula (I):
Hexamethoxymethylmelamine, hexaethoxymethylmelamine, hexabutoxymethylmelamine, tetramethoxymethylmelamine, pentamethoxymethylmelamine and hexahydroxymethylmelamine.

The following are examples of resins corresponding to Formula (II):
Tetramethoxymethyl benzoguanamine, tetreaethoxymethyl benzoguanamine, tetramethoxymethyl acetoguanamine and tetrabutoxymethyl acetoguanamine.

Some of the substances corresponding to Formula (I) are commercially available (e.g. Cymel 303(®) of Cyanamid) and others are available from melamine, formaldehyde and aliphatic alcohols. The substances corresponding to Formula II are also in part commercially available (Cymel 1123(®) of Cyanamid) or obtainable from benzoguanamine (1,3-diamino-5-phenyl-triazine) or acetoguanamine (1,3-diamino-5-methyl-triazine), formaldehyde and aliphatic alcohols.

Examples of rubbers include randomly structured polymers or block copolymers having a glass temperature below −10° C. obtained from ethylene, propylene, butadiene, isoprene, unconjugated dienes, styrene, acrylonitrile, vinyl esters, acrylic acid esters or methacrylic acid esters which may in addition be grafted with acrylonitrile, styrene, conjugated dienes, acrylic acid ester, maleic acid anhydride or methacrylic acid esters and in which diene sequences, if present, may be hydrogenated; preferred examples are copolymers of ethylene with acrylates of aliphatic alcohols and maleic acid anhydride and of ethylene with acrylates of aliphatic alcohols and glycidyl methacrylate or glycidyl acrylate or alkyl glycidyl ether. The copolymers preferably used are commercially available (Lotader ® of CdF).

The inorganic fillers or reinforcing materials used may be glass fibres, glass beads, mica, talc, powdered quartz, kaolin, metal oxides and sulphides, e.g. $TiO_2$, ZnO or ZnS, graphite, carbon black, fibres, e.g. of quartz or carbon, carbonates, e.g. $MgCO_3$ or $CaCO_3$, or sulphates such as $CaSO_4$ or $BaSO_4$.

Pigments, mould release agents, E-waxes, fluidizing agents, nucleating agents and stabilizers are further examples of commonly used additives which may also be included.

Fillers and additives may be used in quantities of from 0 to 300% by weight, based on PAS.

The compositions according to the invention may be produced by the conventional method of extrusion.

The compositions according to the invention may be processed in the usual manner to produce moulded parts semi-finished goods, boards for printed circuits, fibres, films, sections, etc. It is generally advantageous to use the compositions according to the invention wherever thermoplastically processible compositions are normally used.

EXAMPLES

Preparation of the compositions according to the invention was carried out in a double shaft extruder ZSK 32 of Werner & Pfleiderer at 320° C.

The PPS used had a fusion viscosity of 65 PAS (306° C., 1000 1/s) and was prepared according to EP-A 171 021. All percentages are percentages by weight.

The mixtures were granulated and extruded to form test rods measuring 80×10×4 mm. These were tested for notched impact strength (ISO 180 Method 1A).

COMPARISON EXAMPLE 1

80% of PPS and 20% of Cariflex CTR 101(®) styrenebutadiene block copolymer of Shell) were mixed together. The notched impact strength was 4.9 kJ/m$^2$.

EXAMPLE 1

78% of PPS, 20% of Cariflex CTR 101(®) and 2% of Cymel 303(®) (hexamethoxy methylmelamine of Cyanamid) were mixed together. The notched impact strength was 5.2 kJ/m$^2$.

COMPARISON EXAMPLE 2

80% of PPS and 20% of Exxelor 1803(®) (maleic acid anhydride-grafted ethylene-propylene copolymer of Exxon) were mixed together. The notched impact strength was 7.2 kJ/m$^2$.

EXAMPLE 2

78% of PPS, 20% of Exxelor 1803(®) and 2% of Cymel 303(®) were mixed together. The notched impact strength was 11.4 kJ/m$^2$.

COMPARISON EXAMPLE 3

80% of PPS and 20% of Buna AP(®) (ethylene-propylene-diene rubber of Hüls) were mixed together. The notched impact strength was 5.1 kJ/m$^2$.

EXAMPLE 3

80% of PPS, 20% of Buna AP(®) and 2% of Cymel 303(®) were mixed together. The notched impact strength was 8.3 kJ/m$^2$.

COMPARISON EXAMPLE 4

80% of PPS and 20% of P75 28B4(®) (graft rubber of Bayer) were mixed together. The notched impact strength was 5.3 kJ/m$^2$.

EXAMPLE 4

78% of PPS, 20% of 28B4(®) and 2% of Cymel 303(®) were mixed together. The notched impact strength was 7.5 kJ/m$^2$.

COMPARISON EXAMPLE 5

80% of PPS and 20% of Lotader 5500(®) (ethyleneacrylate-maleic acid anhydride copolymer) were mixed together. The mixture could not be processed by injection moulding (friable).

EXAMPLE 5

Range of preference

78% of PPS, 20% of Lotader 5500(®) and 2% of Cymel 303(®) were mixed together. The notched impact strength was 35.3 kJ/m$^2$.

COMPARISON EXAMPLE 6

80% of PPS and 20% of Lotader AG 8660 (®)(epoxy-containing ethyleneacrylate copolymer) were mixed together. The notched impact strength was 10.6 kJ/m$^2$.

EXAMPLE 6

Range of preference

78% of PPS, 20% of Lotader AX 8660(®) and 2% of Cymel 303(®) were mixed together. The notched impact strength was 40.7 kJ/m$^2$.

The examples illustrate the increase in toughness produced by melamine resins in impact modified PPS.

We claim:

1. Compositions of

A) from 94.9 to 40% by weight of polyarylene sulphides,

B) from 0.1 to 5% by weight of melamine resins corresponding to Formula (I)

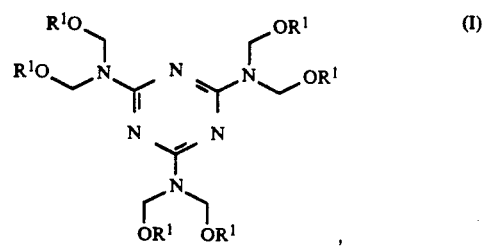

wherein

R$^1$ stands for hydrogen or an aliphatic C$_{1-22}$ group, and up to two alkoxymethyl groups of melamine resins corresponding to Formula (I) according to the invention may be replaced by hydrogen, C) from 5 to 59.9% by weight of rubbers, wherein said rubbers comprise randomly structured polymers or block copolymers having a glass temperature below −10° C. obtained from ethylene, propylene, butadiene, isoprene, unconjugated dienes, styrene, acrylonitrile, vinyl esters, acrylic acid esters or methacrylic acid esters which, optionally, are in addition grafted with acrylonitrile, styrene, conjugated dienes, acrylic acid ester, maleic acid anhydride or methacrylic acid esters and in which diene sequences, if present, may be hydrogenated and D) from 0-300 parts of inorganic fillers or reinforcing materials, based on 100 parts of the mixture (A+B+C).

2. A method of using the compositions according to claim 1, wherein said compositions are processed to form moulded articles.

3. Compositions of

A) from 94.9 to 40% by weight of polyarylene sulphides,

B) from 0.1 to 5% by weight of resins corresponding to Formula (II)

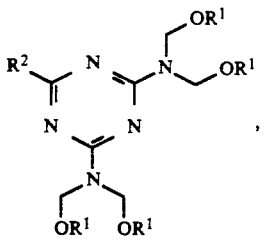

wherein
- $R^1$ stands for hydrogen or an aliphatic $C_{1-22}$ group and
- $R^2$ stands for an aliphatic $C_{1-22}$ group or an aromatic $C_{6-14}$ group, and up to two alkoxymethyl groups of resins corresponding to Formula (II) according to the invention may be replaced by hydrogen, C) from 5 to 59.9% by weight of rubbers, wherein said rubbers comprise randomly structured polymers or block copolymers having a glass temperature below $-10°$ C. obtained from ethylene, propylene, butadiene, isoprene, unconjugated dienes, styrene, acrylonitrile, vinyl esters, acrylic acid esters or methacrylic acid esters which, optionally, are in addition grafted with acrylonitrile, styrene, conjugated dienes, acrylic acid ester, maleic acid anhydride or methacrylic acid esters and in which diene sequences, if present, may be hydrogenated and D) from 0–300 parts of inorganic fillers or reinforcing materials, based on 100 parts of the mixture $(A+B+C)$.

4. Compositions according to claim 1, wherein said polyarylene sulphides consist essentially of polyphenylene sulphide.

5. Compositions according to claim 3, wherein said polyarylene sulphides consist essentially of polyphenylene sulphide.

6. Compositions according to claim 1, wherein $R^1$ is selected from a methyl, ethyl or butyl group.

7. Compositions according to claim 3, wherein $R^2$ is a phenyl group.

8. Compositions according to claim 1, wherein said rubbers are present in an amount of from 10 to 25% by weight.

9. Compositions according to claim 3, wherein said rubbers are present in an amount of from 10 to 25by weight.

10. Compositions according to claim 1, wherein said melamine resins corresponding to Formula (I) are selected from hexamethoxymethylmelamine, hexaethoxymethylmelamine, hexabutoxymethylmelamine, tetramethoxymethylmelamine, pentamethoxymethylmelamine and hexahydroxymethylmelamine.

11. Compositions according to claim 3, wherein said resins corresponding to Formula (II) are selected from tetramethoxymethyl benzoguanamine, tetraethoxymethyl benzoguanamine, tetramethoxymethyl acetoguanamine and tetrabutoxymethyl acetoguanamine.

12. Compositions according to claim 1, wherein said rubbers are copolymers of ethylene with acrylates of aliphatic alcohols and maleic acid anhydride or copolymers of ethylene with acrylates of aliphatic alcohols and glycidyl methacrylate or glycidyl acrylate or alkyl glycidyl ether.

13. Compositions according to claim 3, wherein said rubbers are copolymers of ethylene with acrylates of aliphatic alcohols and maleic acid anhydride or copolymers of ethylene with acrylates of aliphatic alcohols and glycidyl methacrylate or glycidyl acrylate or alkyl glycidyl ether.

14. Compositions according to claim 1, wherein said inorganic fillers or reinforcing materials comprise at least one material selected from the group consisting of glass fibres, glass beads, mica, talc, powdered quartz, kaolin, metal oxides and sulphides, graphite, carbon black, fibres, carbonates and sulphates.

15. Compositions according to claim 3, wherein said inorganic fillers or reinforcing materials comprise at least one material selected from the group consisting of glass fibres, glass beads, mica, talc, powdered quartz, kaolin, metal oxides and sulphides, graphite, carbon black, fibres, carbonates and sulphates.

* * * * *

UNITED STATES PATENT AND TRADEMARK OFFICE
CERTIFICATE OF CORRECTION

PATENT NO. : 5,274,022

DATED : December 28, 1993

INVENTOR(S) : Ruesseler, et al

It is certified that error appears in the above-identified patent and that said Letters Patent is hereby corrected as shown below:

On the Title Page, Item [56], please add the following reference:
--Patent Abstracts of Japan, Vol. 10, No. 67, March 1986--.

Claim 9, column 6, line 7, "25by" should read --25%--.

Signed and Sealed this

Twenty-sixth Day of July, 1994

BRUCE LEHMAN

*Attest:*

*Attesting Officer*          *Commissioner of Patents and Trademarks*

UNITED STATES PATENT AND TRADEMARK OFFICE
CERTIFICATE OF CORRECTION

PATENT NO. : 5,274,022
DATED : December 28, 1993
INVENTOR(S) : Ruesseler et al.

It is certified that error appears in the above-indentified patent and that said Letters Patent is hereby corrected as shown below:

On the title page, item [56], add the following reference:
 --Patent Abstracts of Japan, Vol. 10, No. 67, March 1986--.

Column 6, line 7, claim 9, "25by" should read --25% by--.

This certificate supersedes Certificate of Correction issued July 26, 1994.

Signed and Sealed this

Sixth Day of December, 1994

Attest:

BRUCE LEHMAN

*Attesting Officer*   Commissioner of Patents and Trademarks